United States Patent [19]

Wyshak et al.

[11] 3,898,536

[45] Aug. 5, 1975

[54] MODULAR APPARATUS FOR PRINTED CIRCUIT BOARD RACK

[75] Inventors: Fred M. Wyshak, Marlboro; Harry L. Barrett, Jr., Wayland, both of Mass.

[73] Assignee: Atlee Corporation, Woburn, Mass.

[22] Filed: Jan. 7, 1974

[21] Appl. No.: 431,078

[52] U.S. Cl. ............................ 317/101 DH; 211/41

[51] Int. Cl. ............................................ H02b 1/02

[58] Field of Search ........ 317/101 DH; 211/41, 184; 339/17 M, 17 LM

[56] References Cited

FOREIGN PATENTS OR APPLICATIONS 1,361,752 4/1964 France ........................ 317/101 DH

*Primary Examiner*—David Smith, Jr.
*Attorney, Agent, or Firm*—James J. Cannon, Jr.; John M. Brandt; James J. Cannon

[57] ABSTRACT

A modular apparatus for constructing a printed circuit board guide and rack is disclosed, comprising a plurality of spaced apart mounting bars and guide rails, each guide rail having a pair of parallelogram-shaped protrusions at each end which mate with similarly shaped recesses in the mounting bars. Alignment of the opposed ends of the guide rails in the mounting bars is facilitated by a central rectangular protrusion between said parallelogram shaped protrusions which fits into a recess in said mounting bars and is visible from the exterior sides of said bars. A board receiving groove is located in the guide rail face opposite the protrusions. A frame is provided for assembling the mounting bars in rack relationship; a pair of guide rails, one each above and below the board, is used for each board to be mounted, and a pair of mounting bars is used for each level of guide rails.

5 Claims, 4 Drawing Figures

MODULAR APPARATUS FOR PRINTED CIRCUIT BOARD RACK

BACKGROUND OF THE INVENTION

1. Field of the Invention

The invention relates to electrical component support hardware and more particularly to modular racks for printed circuit boards.

2. Description of the Prior Art

A number of rack systems for supporting printed circuit boards exists in the prior art. The purposes and goals of such racks are several, including the protection of boards against shock and disruption, provision for easy board insertion and removal from the rack, positive and firm electrical contact between the board and wiring connectors attached to the rack, expansion or reduction of rack size or capacity, and rack stability in adverse environments of stress, vibration, thermal extremes, and the like.

Various component systems have been designed to satisfy these requirements. They are comprised chiefly of guide rails which hold the circuit boards, mounting bars which hold the guide rails and frameworks for arranging the mounting bars.

The present invention is directed toward such a system which, through its unique structure, has been found to be well suited to meet the design criteria listed above. In particular, it provides simplified alignment of the guide rails in the mounting bars, thus providing more convenient and faster assembly of the racks. Furthermore, this unique structure provides guide rails which require smaller space for insertion into the mounting bars, thus providing a greater packing density, i.e., a greater number of guide rails per linear unit of mounting bar. This, in turn, permits a greater density of circuit boards within any given rack size.

SUMMARY OF THE INVENTION

The present invention may be summarized as a modular component apparatus for the construction of a printed circuit board guide and support rack comprising a plurality of substantially identical guide rails having parallelogram shaped protrusions on each side of each end thereof which mate with similarly shaped recesses in mounting bars positioned perpendicular to the guide rail. The lower surfaces of the parallelogram shaped protrusions are skewed toward the ends of the guide, providing a locking mechanism when the guide rail is pressed between two mounting bars held in place by a frame. Additionally, there are rectangular protrusions between said parallelogram shaped protrusions which fit into recesses in said mounting bars to secure said guide rails further and to provide a visual means of alignment.

These additional rectangular key protrusions which are provided on each end of each guide rail, fit into slots spaced along and through the mounting bars. These rectangular protrusions fix the guide rails longitudinally along the mounting bars and prevent rotation in the guide rail plane, further securing the guide rails and the printed circuit boards. Without the rectangular key protrusions, the guide rails may be packed tightly along the mounting bars, one against the other to accomplish the same purpose.

The location of the rectangular protrusions through each side of the mounting bars facilitates a simple visual alignment of the ends of the guide rails into corresponding recesses in the mounting bars, thus making assembly of racks easier and less expensive.

The opposite face of each guide rail has a board receiving groove. In use, a circuit board is mounted snugly between two guide rails serving to bias or extend each guide rail outward such that it firmly locks into the mounting bars.

The mounting bars may have the parallelogram shaped recesses and rectangular shaped recesses located on two opposite sides allowing several tiers of boards in one rack.

Thus the components described may be assembled and stacked in a variety of convenient configurations to meet the needs of individual users.

These and other features and advantages of the present invention will become more apparent from the following drawings and description of the preferred embodiment.

DESCRIPTION OF THE PREFERRED EMBODIMENT

Figures 1, 2:
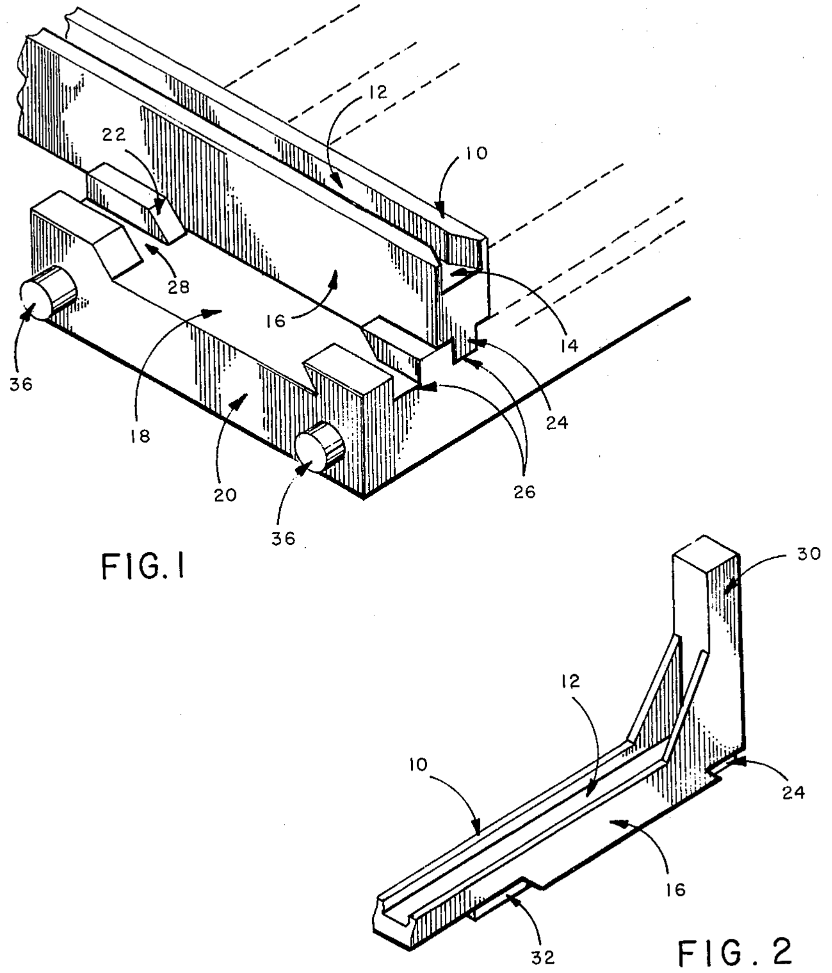
FIG. 1 is a perspective view of a portion of the preferred embodiment of the present invention showing the novel features of the invention.
FIG. 2 is a perspective view of a portion of the guide rail component of the present invention.

Referring first to FIG. 1, where there is shown a perspective view of a portion of the components of the present invention, guide rail 10 has a circuit board edge receiving groove 12 disposed in its upper surface. As illustrated, the end 14 of groove 12 may be flared outward to facilitate the insertion of a printed circuit board. Parallelogram shaped protrusions 16 are positioned opposite groove 12 on each side of each end of guide rail 10 and fit snugly into recesses 18 in mounting bar 20. The lower surfaces of the protrusions 16 are skewed toward the end of the guide rail 10 such that the forward or outer edges lock into the recesses 18 in the manner of an undercut preventing vertical movement. The opposite rear surface 22 of the recesses 18 acts as a cam to slide the protrusion 16 into the recess 18.

Additional rectangular key protrusions 24 are positioned between, forward and rearward of the parallelogram shaped protrusions to secure further the guide rails 10 in the horizontal plane and to assist in aligning the guide rails 10 in the corresponding recesses 18, 26 on two spaced apart mounting bars 20 for proper interfacing with the electrical connectors. This structure permits simple, visual alignment of each end of guide rails 10 into corresponding recesses on each of two mounting bars 20. Forward key 24 fits into slot 26; as does additional rear key, not shown, into slot 28.

Referring now to FIG. 2, the opposite end of guide rail 10 is depicted showing stop 30 which limits the rearward movement of a circuit board as it is inserted, serving to prevent damage to the electrical connectors. Rear key 32 discussed above is illustrated here.

Figure 3:
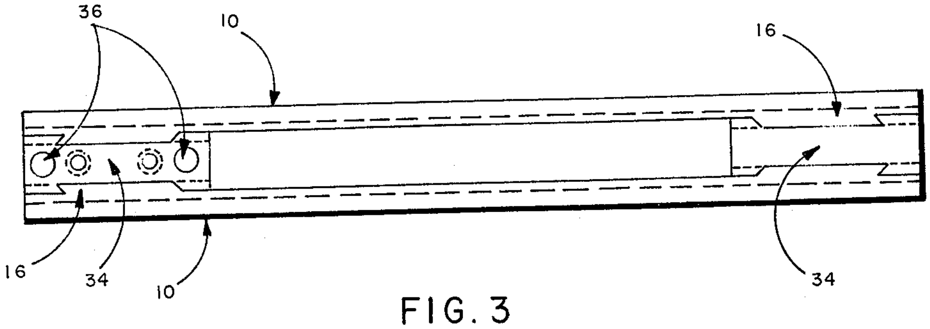
FIG. 3 is a side view of the invention assembled.

FIG. 3 illustrates mounting bars 34 with recesses on each side which would be used for example as the central support for a double tiered rack assembly. FIG. 3 further shows the configuration of guide rails 10 indicating that the parallelogram shaped protrusions 16 are oppositely skewed, each toward its own guide rail end. Pegs 36, also shown in FIG. 1, fit into holes 38 in frame side 40 as shown in FIG. 4.

Figure 4:
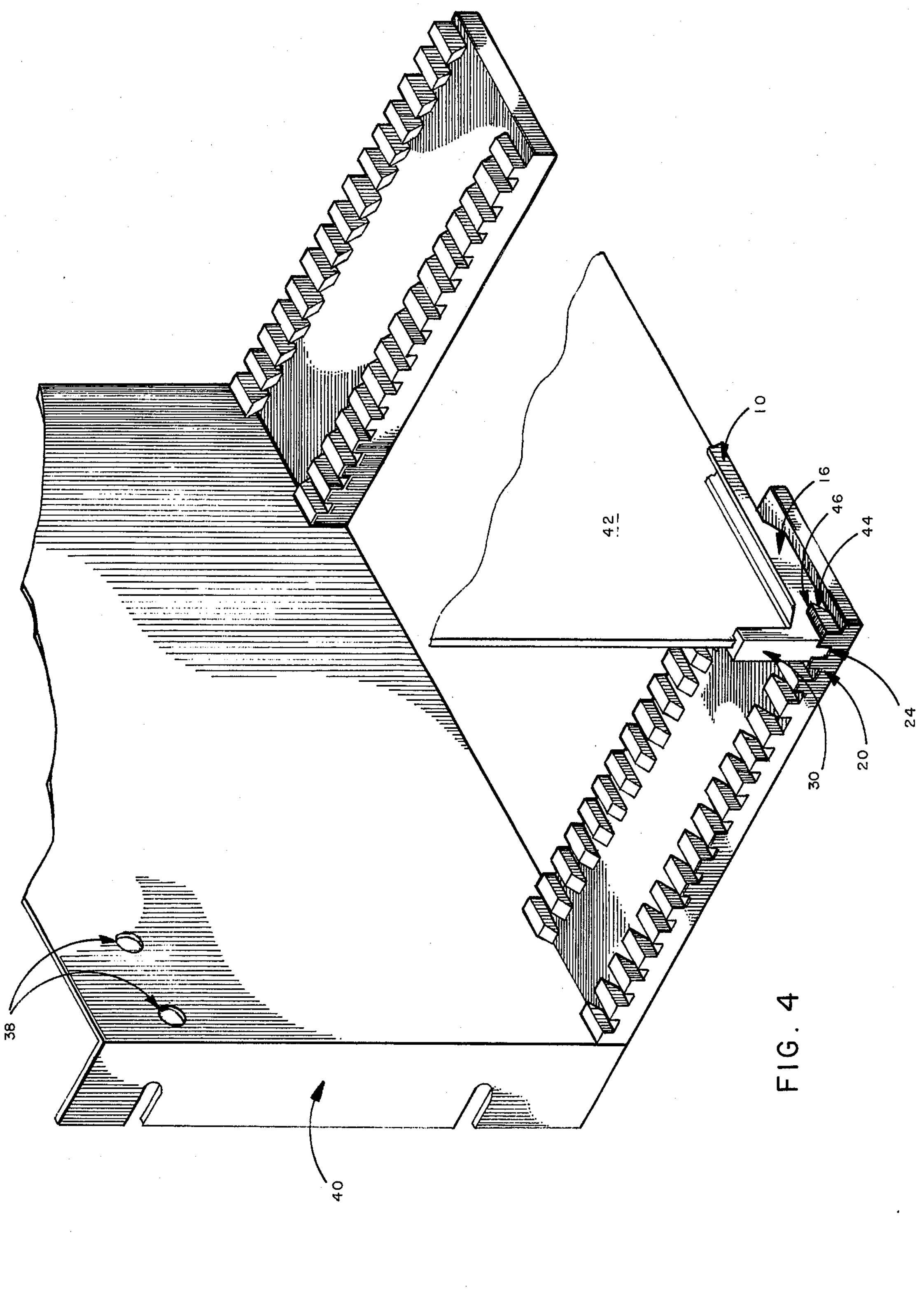
FIG. 4 is a perspective view of the present invention assembled in a rack configuration.

Also illustrated in FIG. 4 is the manner in which a printed circuit board card 42 is held in the rack. The view is from the rear where electrical connectors and harnesses, not shown, would be located, attached to a frame cross member. The guide rails 10 are preferably constructed of a resilient plastic-like material which flexes easily. Once the mounting bars 20 are assembled into a rack skeleton, the guide rails 10 are inserted by bending them in the middle such that the lower or outer end tips 44 of the protrusions 16 clear the upper end tips 46 of the bar portion forming the boundary of the recess 18. When released the guide rail protrusions 16, 24 slip into their respective recesses 18 and slots 26. Inserting a circuit board biases the guide rails 10 further against and into the mounting bars 20, locking the entire assembly firmly into place in proper alignment.

The novel locking structure on each end of guide rail 10 comprising two parallelogram shaped protrusions 16 with a rectangular shaped protrusion 24 between them permits guide rail 10 to be securely held in position on mounting bars 20 while enabling guide rail 10 to be manufactured substantially narrower than previously possible. This structure thus permits a greater density of circuit boards per linear unit of mounting bar. The visual alignment of the guide rails in the mounting bars substantially improves the efficiency of assembly of a densely packed rack.

It will be appreciated that variations in the above described structure will be apparent upon reading of the above description. Accordingly, the novel features of the present invention are defined in the following claims.

We claim:

1. A modular component apparatus for constructing a printed circuit board guide and support rack comprising in combination:

a longitudinal guide rail having a circuit board edge receiving groove longitudinally disposed in one face thereof;

said guide rail having at least one parallelogram shaped protrusion longitudinally positioned at each end of said guide rail on the face opposite said groove, the lower surface of each of said protrusions skewed toward its associated guide rail ends;

a mounting bar positioned at each end of said guide rail perpendicular to the longitudinal axis of said guide rail, said bars having a guide rail protrusion receiving recess longitudinally disposed in at least one face thereof; and frame means for joining said mounting bars in rack configuration.

2. The apparatus of claim 1 wherein said guide rail has additionally a first rectangular key protrusion extending longitudinally forward of each of said parallelogram shaped protrusions and wherein said mounting bars have first rectangular key protrusion receiving slots disposed along and through their outer edges transverse the longitudinal axes of said mounting bars.

3. The apparatus of claim 2 wherein said guide rail has additionally a second rectangular key protrusion extending longitudinally rearward of each of said parallelogram shaped protrusions of a width narrower than said parallelogram shaped protrusions and wherein said mounting bars have second key protrusion receiving slots disposed along and through their inner edge transverse the longitudinal axis of said mounting bars.

4. The apparatus of claim 3 wherein said rectangular key protrusion receiving slots are spaced along said bar at intervals less than the width of said guide rail.

5. The apparatus of claim 1 wherein said mounting bars have said recesses disposed on two faces thereof.

* * * * *